(12) United States Patent
Dwivedi

(10) Patent No.: US 12,716,783 B2
(45) Date of Patent: Aug. 25, 2026

(54) HIGH ACCURACY FAST VOLTAGE AND TEMPERATURE SENSOR CIRCUIT

(71) Applicant: STMicroelectronics International N.V., Geneva (CH)

(72) Inventor: Atul Dwivedi, Benares (IN)

(73) Assignee: STMicroelectronics International N.V., Geneva (CH)

( * ) Notice: Subject to any disclaimer, the term of this patent is extended or adjusted under 35 U.S.C. 154(b) by 912 days.

(21) Appl. No.: 17/965,282

(22) Filed: Oct. 13, 2022

(65) Prior Publication Data

US 2023/0140251 A1 May 4, 2023

Related U.S. Application Data

(60) Provisional application No. 63/273,651, filed on Oct. 29, 2021.

(51) Int. Cl.
*G01K 7/01* (2006.01)
*G01K 7/18* (2006.01)
(Continued)

(52) U.S. Cl.
CPC ............. *G01K 7/015* (2013.01); *G01K 7/183* (2013.01); *H03M 1/1245* (2013.01); (Continued)

(58) Field of Classification Search
None
See application file for complete search history.

(56) References Cited

U.S. PATENT DOCUMENTS 7,340,366 B2 3/2008 Aas et al.
9,405,337 B2 8/2016 Kim et al.
(Continued)

FOREIGN PATENT DOCUMENTS

CN 207268657 U 4/2018
CN 111213041 A 5/2020
(Continued)

OTHER PUBLICATIONS

CN Notice of Allowance for counterpart CN Appl. No. 202211335106.8, report dated Aug. 1, 2025, 5 pgs.
(Continued)

*Primary Examiner* — Erica S Lin
(74) *Attorney, Agent, or Firm* — Crowe & Dunlevy LLC

(57) ABSTRACT

A temperature sensing circuit includes a current generation circuit generating an initial current proportional to absolute temperature (Iptat), and a voltage generation circuit configured to mirror Iptat using an adjustable current source to produce a scaled current and to source the scaled current to a first terminal of a resistor to produce a reference voltage at the first terminal. A second terminal of the resistor has a voltage complementary to absolute temperature (Vctat) applied thereto. An analog-to-digital converter (ADC) has a reference input receiving the reference voltage, and a data input receiving Vctat or an externally sourced voltage. The ADC generates an output code indicative of a ratio between: a) either Vctat or the externally sourced voltage, and b) the reference voltage. A digital circuit determines a temperature readout from the output code and calibrates the reference voltage and the temperature readout determination based upon the output code.

21 Claims, 6 Drawing Sheets

(51) Int. Cl.
*H03M 1/12* (2006.01)
*H03M 1/36* (2006.01)
*H03M 1/46* (2006.01)

(52) U.S. Cl.
CPC ............. *H03M 1/361* (2013.01); *H03M 1/46* (2013.01); *G01K 2219/00* (2013.01)

(56) References Cited

U.S. PATENT DOCUMENTS

| | | | |
|---|---|---|---|
| 9,448,122 | B2 | 9/2016 | Chang et al. |
| 9,719,861 | B2 | 8/2017 | Ramaraju et al. |
| 9,977,454 | B1 | 5/2018 | Krishnamoorthy |
| 10,078,016 | B2 | 9/2018 | Wadhwa |
| 10,151,786 | B2 | 12/2018 | Jain et al. |
| 10,502,622 | B2 | 12/2019 | Smith et al. |
| 2015/0226614 | A1* | 8/2015 | Matsumoto ............. G01K 7/01 374/171 |
| 2020/0278708 | A1 | 9/2020 | Tesch |
| 2021/0239540 | A1 | 8/2021 | Dwivedi et al. |

FOREIGN PATENT DOCUMENTS

| | | | |
|---|---|---|---|
| KR | 100608111 | B1 | 8/2006 |
| KR | 1020150122911 | A | 11/2015 |
| WO | 2006030374 | A2 | 3/2006 |

OTHER PUBLICATIONS

Gupta, Ashish Kumar et al: "Risks and Precautions to Take Care While Using On-Chip Temperature Sensors in Safety Critical Automotive Applications," Design-Rouse.com, 2021 (4 pages).
Fayomi, C.: "Novel Approach to Low-Voltage Low-Power Bandgap Reference Voltage in Standard CMOS Process," Research Paper, Jan. 2007, 5 pgs. bn.

* cited by examiner

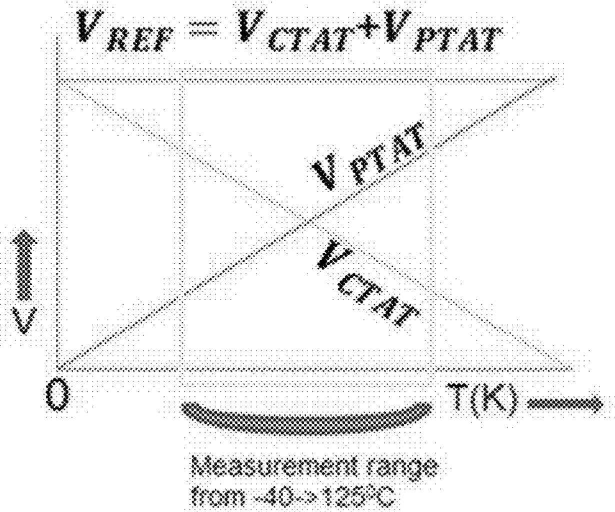
FIG. 1A
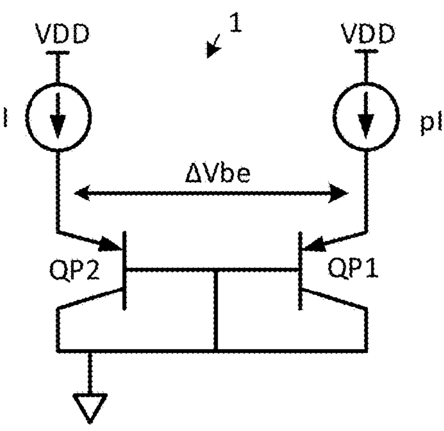
FIG. 1B (Prior Art)
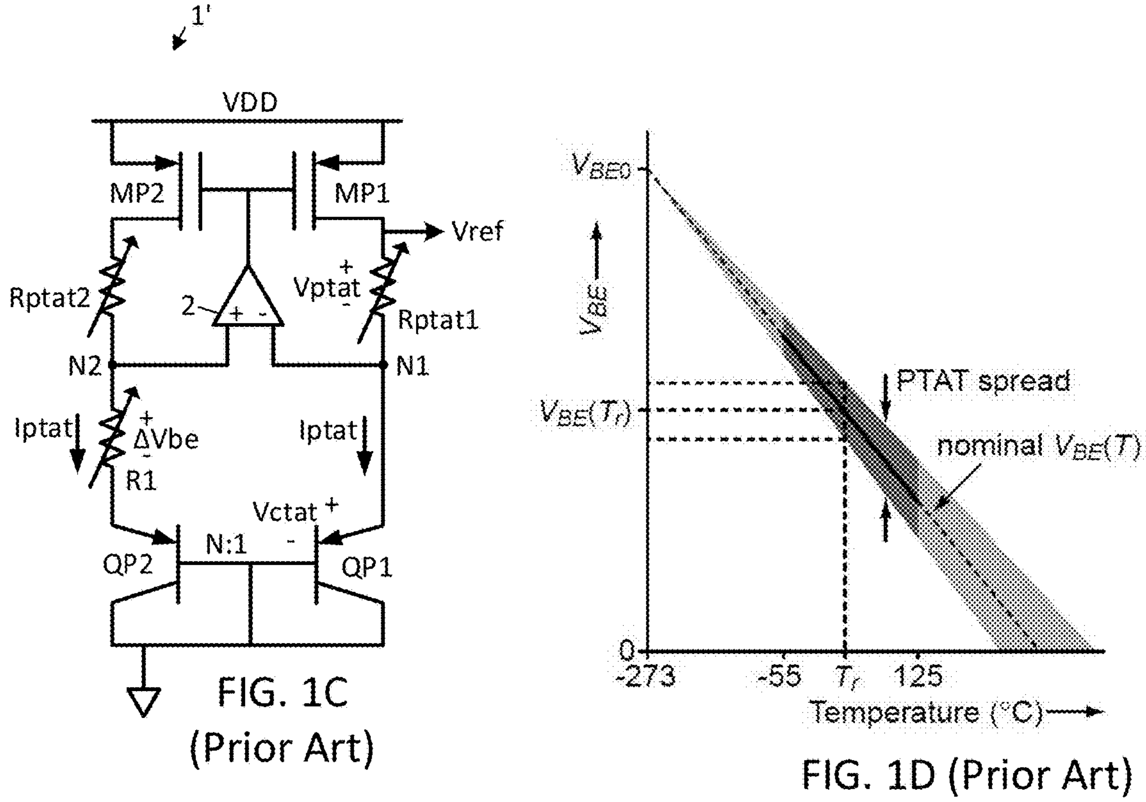
FIG. 1C (Prior Art)
FIG. 1D (Prior Art)

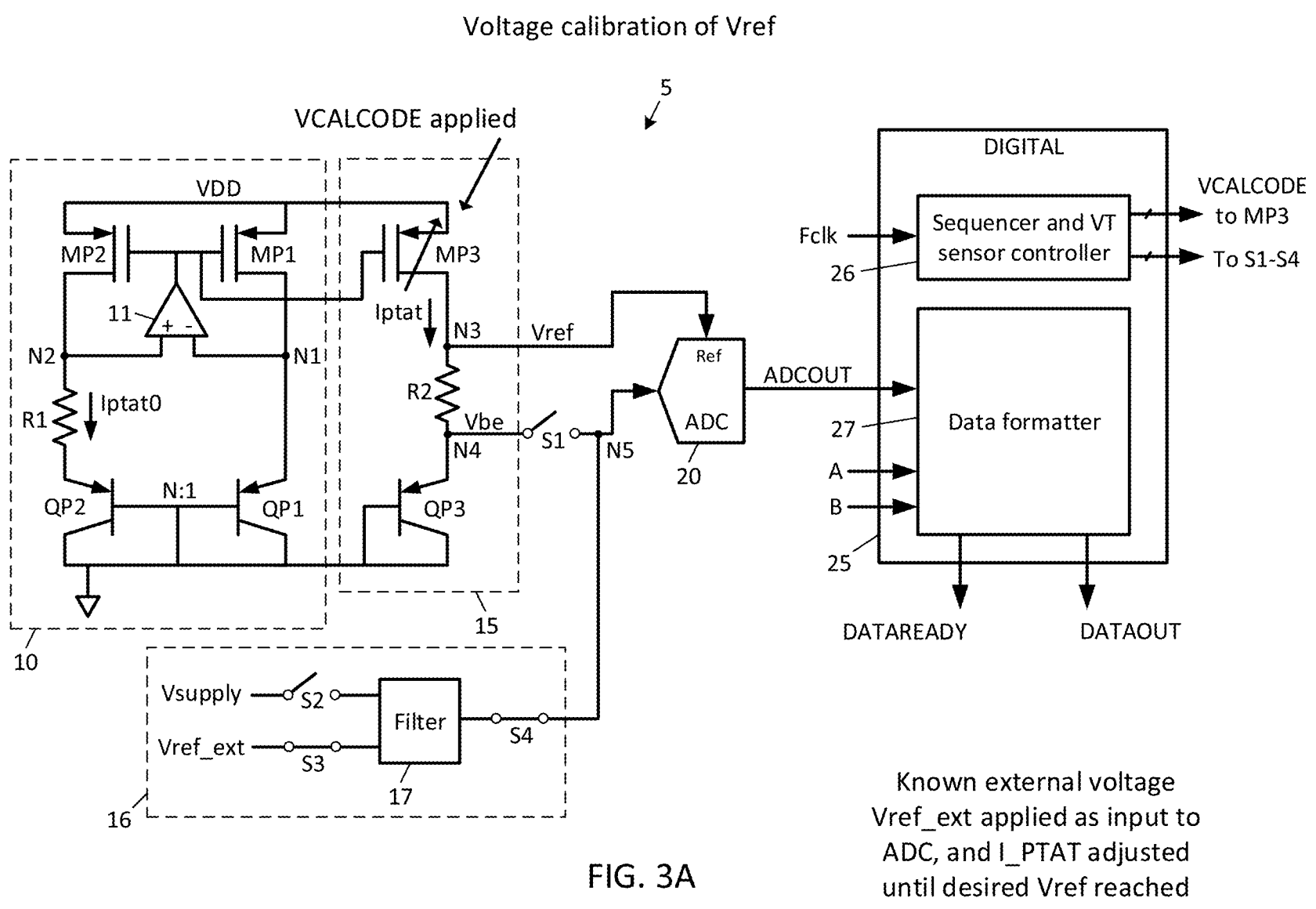

Voltage calibration of Vref

Known external voltage Vref_ext applied as input to ADC, and I_PTAT adjusted until desired Vref reached

FIG. 3A

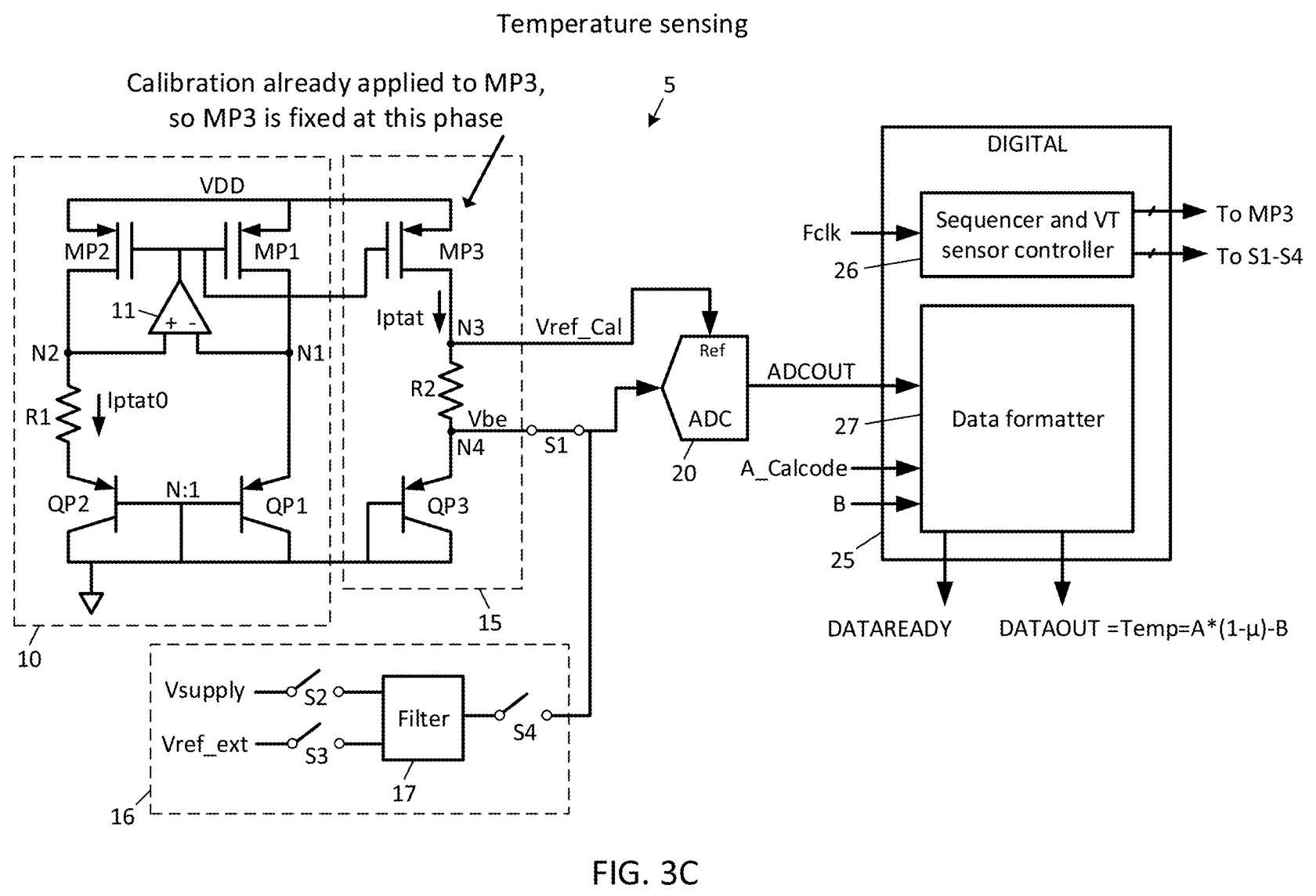

Temperature sensing
5
Calibration already applied to MP3, so MP3 is fixed at this phase
VDD
MP3
MP1
MP2
11
N1
N2
N3
N4
Iptat
Iptat0
R1
R2
Vbe
QP1
QP2
QP3
N:1
10
15
Vref_Cal
S1
S2
S3
S4
Filter
17
16
Vsupply
Vref_ext
Ref
ADC
20
ADCOUT
A_Calcode
B
Fclk
26
27
25
DIGITAL
Sequencer and VT sensor controller
Data formatter
To MP3
To S1-S4
DATAREADY
DATAOUT =Temp=A*(1-μ)-B

FIG. 3C

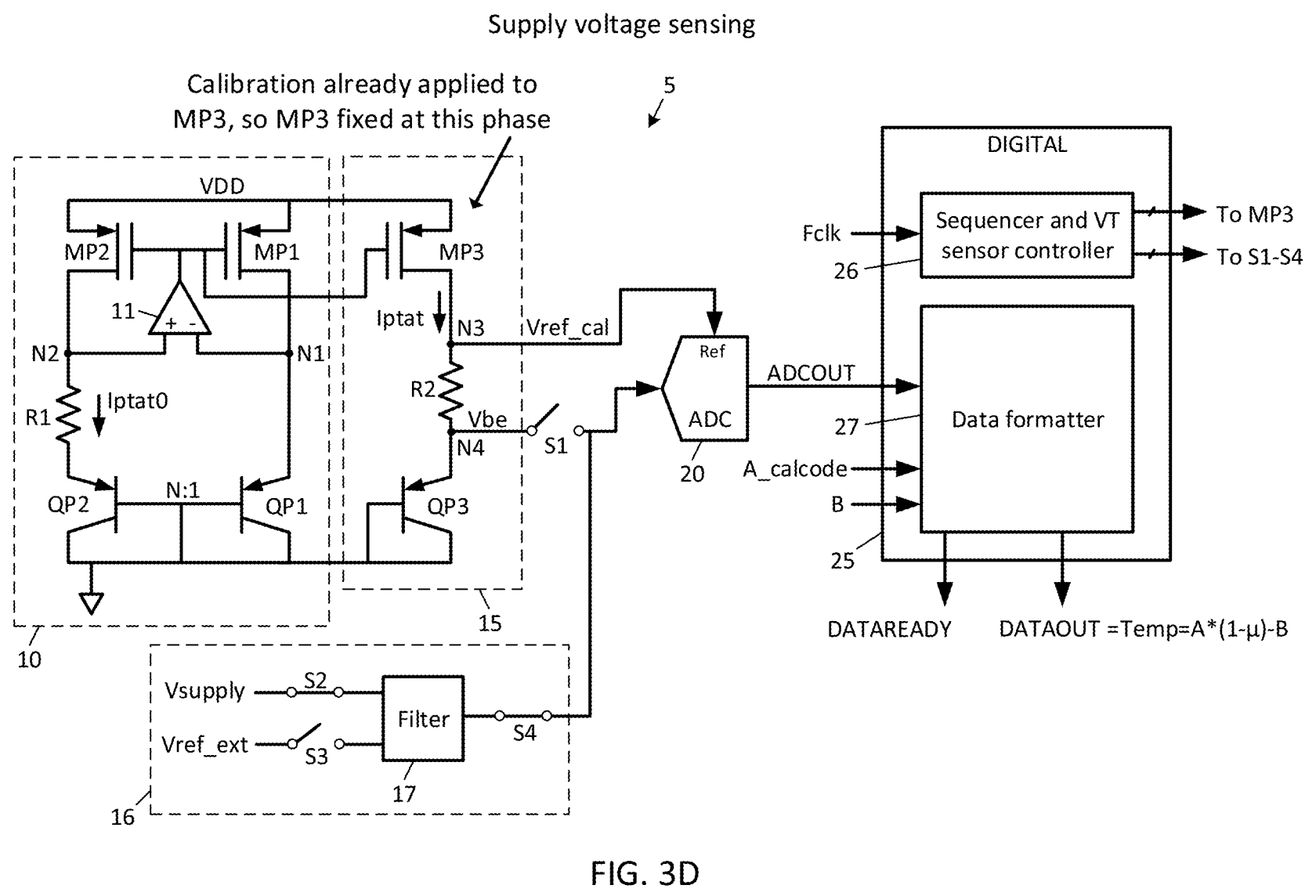

Supply voltage sensing

5

Calibration already applied to MP3, so MP3 fixed at this phase

VDD

MP1

MP2

MP3

11

N1

N2

N3

N4

Iptat0

Iptat

R1

R2

Vbe

QP1

QP2

QP3

N:1

10

15

Vref_cal

S1

S2

S3

S4

Vsupply

Vref_ext

Filter

17

16

Ref

ADC

20

ADCOUT

Fclk

26

27

A_calcode

B

25

DIGITAL

Sequencer and VT sensor controller

Data formatter

To MP3

To S1-S4

DATAREADY

DATAOUT =Temp=A*(1-μ)-B

FIG. 3D

HIGH ACCURACY FAST VOLTAGE AND TEMPERATURE SENSOR CIRCUIT

RELATED APPLICATION

This application claims priority to United States Provisional Application for Patent No. 63/273,651, filed Oct. 29, 2021, the contents of which are incorporated by reference in their entirety to the maximum extent allowable under the law.

TECHNICAL FIELD

This application is directed to the field of temperature and voltage sensing circuits and, in particular, to a temperature and voltage sensing circuit utilizing an adjustable current source in the generation of a temperature independent reference voltage for use in generating a highly accurate digital representation of a temperature value of the integrated circuit chip into which the temperature sensing circuit is placed.

BACKGROUND

Systems on a chip (SOCs) are used in mobile devices such as smartphones and tablets, as well as in numerous embedded systems. Some current SOCs are capable of temperature-aware task scheduling, as well as self-calibration with respect to temperature to help reduce power consumption. Temperature and voltage sensors are also used in image sensing applications to adjust for voltage and temperature shifts of image sensors while in use. In order to enable this functionality, such SOCs include on-chip temperature sensors integrated with other components of the SOCs A voltage proportional to absolute temperature Vptat can be produced as the difference between the base-emitter junction voltages of two bipolar junction transistors biased at different current densities. Mathematically, this can be represented as: Vptat=ΔVbe=Vbe1-Vbe2. This voltage proportional to absolute temperature Vptat is relatively error free, because the errors in Vbe1 and Vbe2 due to lack of ideal performance of the transistors cancel each other out.

The relationship between Vptat and temperature can be mathematically represented as as Vptat=kT/q ln(p), where T is the temperature in Kelvin, where k is the Boltzmann constant, q is the magnitude of the charge of an electron, and p is the ratio of the current densities of the bipolar junction transistors used to generate Vptat. An analog to digital converter (ADC) digitizes Vptat with respect to a reference voltage Vref, and as a result, outputs a ratio μ that can be calculated as μ=Vptat/Vref. This ratio can be scaled appropriately to yield a digital temperature reading in a desired unit, for example: Temperature (C°)=A*μ+B, where A and B are constants.

To achieve temperature independence, the reference voltage Vref is typically generated as the sum of the voltage proportional to absolute temperature Vptat and a voltage complementary to absolute temperature Vctat, as can be seen in FIG. 1A, which in ideal conditions, would produce a truly temperature independent reference voltage. The voltage complementary to absolute temperature Vctat is produced as the base-emitter junction voltage Vbe of a bipolar junction transistor.

A challenge arises when it is desired to use known techniques to update the generated digital temperature readings at a high frequency, for example, every 10 μs. In order to sample Vref and ΔVbe at a high frequency, sampling capacitors are to be charged and discharged very quickly. However, with conventional temperature sensors, this is not possible, because common bipolar junction transistors typically used in thermal sensor applications (e.g., the parasitic substrate PNP bipolar junction transistors available in standard CMOS process) cannot be biased at higher currents (more than 2-3 μA per bipolar junction transistor) and function properly as thermal sensors. If the bipolar junction transistors are increased in numbers (e.g., multiple bipolar junction transistors connected in parallel) to increase the current by which they can be biased, the capacitance of the transistors eventually dominates and/or results in area/power penalty, and therefore such an approach can only be taken so far, and desired operating speeds may still be unreachable.

Attempts at increasing the speed can be made where ΔVbe is obtained by using different multiples of bipolar junction transistors biased at same currents. A sample temperature sensor 1 utilizing this technique is shown in FIG. 1B, where it can be observed that the temperature sensor 1 includes a PNP bipolar junction transistor QP2 having its emitter receiving a current I, its collector grounded, and its base connected to the base of another PNP bipolar junction transistor QP1. Bipolar junction transistor QP1 has its emitter receiving a scaled current pI (e.g., the current I scaled by a scaling factor p), its collector grounded, and its base connected to the base of bipolar junction transistor QP2. The voltage ΔVbe is the difference between the base-emitter voltages of QP1 and QP2. The slowest node in the temperature sensor 1 is the emitter of QP2. If current I is insufficient to meet the desired speed, and it is desired to scale the current by a factor of 100 which leads to scaling of the temperature sensor 1 by a factor of 100 (for identical accuracy), then it is desired for the bipolar junction transistors QP1 and QP2 to be scaled by a factor of 100 (e.g., by using 100 bipolar junction transistors QP1, QP2 connected in parallel) so that the resultant current will be increased from pI to (p+1)*100. As explained though, using this design, the capacitance of the transistors eventually dominates and/or results a penalty in terms of power consumption and area consumption. Therefore, such an approach can only be taken so far, and desired operating speeds may still be unreachable.

Another attempt at increasing the speed can be made where ΔVbe is obtained by using different multiples of bipolar junction transistors biased at same currents. Such an example of a temperature sensor 1' is shown in FIG. 1C, where it can be observed that the temperature sensor 1' includes a PNP bipolar junction transistor QP1 having its emitter connected to a node N1, its collector grounded, and its base connected to its collector to thereby produce a voltage complementary to absolute temperature Vctat across its emitter-base junction. The temperature sensor 1' further includes a first adjustable resistor Rptat1 connected between the node N1 and a drain of p-channel transistor MP1. The source of p-channel transistor MP1 is connected to a supply voltage VDD, and the gate of p-channel transistor MP1 is connected to the gate of p-channel transistor MP2. The p-channel transistor MP2 also has its source connected to the supply voltage VDD and its drain connected to a second adjustable resistor Rptat2. The second adjustable resistor Rptat2 is connected between the drain of MP2 and node N2, and a resistor R1 is connected between node N2 and the emitter of PNP bipolar junction transistor QP2. The collector of PNP transistor QP2 has its collector connected to ground, and its base connected to the base of PNP transistor QP1 as well as to ground. Note therefore that PNP transistors QP1 and QP2 are both diode coupled. An amplifier 2 has its non-inverting terminal connected to node N2 and its inverting terminal connected to node N1, as well as its output connected to the gates of p-channel transistors MP1 and MP2.

In operation, amplifier 2 drives the gates of transistors MP1 and MP2 to force the voltage at the inverting input of the amplifier 2 to be equal to the voltage at the non-inverting input of the amplifier 2 by changing the gate voltages and ultimately currents of transistors MP1 and MP2. This results in the base to emitter voltage Vbe1 of PNP transistor QP1 (which is a voltage complementary to absolute temperature Vctat) appearing at the node N2. Since resistor R1 is between the voltages Vbe1 and Vbe2 (the base to emitter voltage of transistor QP2), the voltage across resistor R1 is Vbe1-Vbe2, which can be referred to as ΔVbe. The resulting current Iptat flowing through resistor R1 is:

$$Iptat = \frac{\Delta Vbe}{R}$$

The current Iptat is proportional to absolute temperature (ignoring the temperature variation of resistivity of R1) and flows into PNP transistors QP1 and QP2 too.

Since, the voltage at node N1 is Vctat (the base to emitter voltage Vbe of transistor QP1), a reference voltage Vref can be obtained at the drain of transistor MP1 by suitable scaling of resistors R1 and Rptat1,2 by adding an appropriate PTAT voltage on top of the Vctat voltage at node N1. The reference voltage Vref can thus be represented as:

$$Vref = Vctat + \frac{\Delta Vbe}{R} Rptat1,2 = Vctat + \alpha\Delta Vbe$$

Keeping in mind that ΔVbe is a voltage proportional to absolute temperature Vptat (the temperature coefficients of R1 and Rptat1/Rptat2 cancel out from the Vref expression):

$$Vref = Vctat + Vptat$$

The accuracy of this temperature reading is dependent primarily upon the temperature independence of the reference voltage Vref. However, due to the lack of ideal performance of the transistor, errors are introduced. Mathematically, the real world Vbe produced can be represented as: $Vbe=Vbe0-\lambda T+C(T)$, where Vbe0 is the value of Vbe at 0° K, λ is the slope of decay of Vbe0 with temperature, and C(T) is a non-linear quantity.

The slope λ is process dependent, therefore introduces inaccuracy in Vbe, and hence in the produced reference voltage Vref. A sample spread of Vbe values resulting from different values of the slope λ can be seen in FIG. 1D, in which it can be noted that the inaccuracy introduced into Vbe by the slope λ is linear.

Using the design of FIG. 1C, Iptat can be adjusted so as to attempt to compensate Vref for the type of Vbe spread shown in FIG. 1D in an attempt to keep Vref as being as temperature independent as possible so that μ, described above, and therefore the temperature reading, is as accurate as possible. This adjustment of Iptat can be performed by adjusting the resistance values of the adjustable resistances Rptat1/Rptat2 and R1. However, the accuracy of this adjustment is limited by the resistance of the smallest resistance in the adjustable resistances Rptat1/Rptat2 and R1. The high rate conversion (e.g., one conversion every 10 us) requires the currents in these two branches to be very high, resulting in very small resistance values. For example, to adjust Iptat sufficiently such that the temperature calculation is accurate to within 1° C., the resistance of the smallest resistance in the adjustable resistances Rptat1/Rptat2 and R1 can get as low as 5Ω; thus, the associated switch needs to have a resistance less than this value, which leads to high area consumption. Moreover, a challenge is presented in that this design has two variables—the resistance of R1, and the resistance of Rptat1/Rptat2 (which are matched to one another), and these resistances cannot effectively be independently changed, as one will affect the other.

In order to overcome these accuracy limitations, as well as to ease calibration, further development is needed.

SUMMARY

Disclosed herein is a temperature sensing circuit, including a current generation circuit configured to generate an initial current proportional to absolute temperature, and a voltage generation circuit configured to mirror the initial current proportional to absolute temperature using an adjustable current source to produce a scaled current, and to source the scaled current to a first terminal of a resistor to produce an internal reference voltage at the first terminal, with a second terminal of the resistor having a voltage complementary to absolute temperature applied thereto. An analog to digital converter has a reference input configured to receive the internal reference voltage, and a data input configured to selectively receive one of the voltage complementary to absolute temperature or an externally sourced voltage. The analog to digital converter is configured to generate an output code indicative of a ratio between: a) either the voltage complementary to absolute temperature or the externally sourced voltage, and b) the internal reference voltage. A digital circuit is configured to determine a temperature readout from the output code, and to calibrate the internal reference voltage and the temperature readout based upon the output code.

The digital circuit calibrates the internal reference voltage by passing a known reference voltage to the analog to digital converter as the externally sourced voltage, and adjusting the adjustable current source to thereby modify a magnitude of the scaled current, in turn modifying the internal reference voltage, dependent upon the output code, until the internal reference voltage is equal to the known reference voltage or equal to a known percentage of the known reference voltage.

The digital circuit calibrates the temperature readout determination, after calibration of the internal reference voltage, by comparing the temperature readout from the output code to a known temperature, and adjusting a constant used in determining the temperature readout until the temperature readout matches the known temperature.

The output code is calculated as $\mu=Vctat/Vref$, where Vctat is the voltage complementary to absolute temperature and Vref is the internal reference voltage.

The temperature readout is determined as $T=A\times(1-\mu)-B$, where T is the temperature, A and B are constants with A being the adjusted constant, and μ is the output code.

The digital circuit is further configured to determine a voltage value of an external or internal supply voltage or any other voltage by passing that voltage to the analog to digital converter as the externally sourced voltage, and determining the voltage value as a function of the internal reference voltage and the output code.

The current generation circuit may include: a first PNP transistor having an emitter coupled to a first node, a collector coupled to ground, and a base coupled to the collector of the first PNP transistor; a second PNP transistor having an emitter coupled to a second node through a first resistor, a collector coupled to ground, and a base coupled to the base of the first PNP transistor; a first p-channel transistor having source coupled to a supply voltage, a drain coupled to the first node, and a gate; and a second p-channel transistor having a source coupled to the supply voltage, drain coupled to the second node, and a gate coupled to the gate of the first p-channel transistor. Equality may be enforced between drain currents of the first and second p-channel transistors. The first resistor may be coupled between the second node and the emitter of the second PNP transistor.

The equality may be enforced between the drain currents of the first and second p-channel transistors by an operational amplifier having a non-inverting terminal coupled to the second node, an inverting terminal coupled to the first node, and an output coupled to the gates of the first and second p-channel transistors.

The voltage generation circuit may include: the adjustable current source coupled between the supply voltage and a third node; the resistor being coupled between the third node and a fourth node; and a diode coupled PNP transistor generating the voltage complementary to absolute temperature at the fourth node.

The adjustable current source may be an adjustable transistor arrangement having sources coupled to the supply voltage, drains coupled to the third node, and gates coupled to the gates of the first and second p-channel transistors.

A first switch may be coupled to selectively apply the voltage complementary to absolute temperature or the externally sourced voltage to the data input of the analog to digital converter. An input circuit may include: a filter; a second switch selectively applying an external supply voltage to the filter; a third switch selectively supplying the known reference voltage to the filter; and a fourth switch selectively supplying output from the filter to the data input of the analog to digital converter.

BRIEF DESCRIPTION OF THE DRAWINGS

FIG. 1A is a graph showing generation of a temperature independent reference voltage (Vref) in a temperature sensor by summing a voltage proportional to absolute temperature (Vptat) and a voltage complementary to absolute temperature (Vctat).

FIG. 1B is a schematic diagram of a first prior art bandgap voltage generator.

FIG. 1C is a schematic diagram of a second prior art bandgap voltage generator.

FIG. 1D is a graph showing how the slope of the voltage of the base-emitter junction of the bipolar junction transistor used to generate Vctat (also referred to as Vbe) across temperature is process dependent (varies from transistor to transistor due to process variation).

FIG. 3A shows the voltage and temperature sensor of FIG. 2 when performing voltage (Vref) calibration.

FIG. 3C shows the voltage and temperature sensor of FIG. 2 when performing temperature sensing.

FIG. 3D shows the voltage and temperature sensor of FIG. 2 when performing supply voltage sensing.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete or integrated device unless the contrary is stated, and is not simply an electrical lead between two points. Thus, any described resistor or resistance coupled or connected between two points has a greater resistance than a lead or trace between those two points would have, and such resistor or resistance cannot be interpreted to be a lead or trace. Stated differently, the resistors described herein are not leads or traces.

Figure 2:
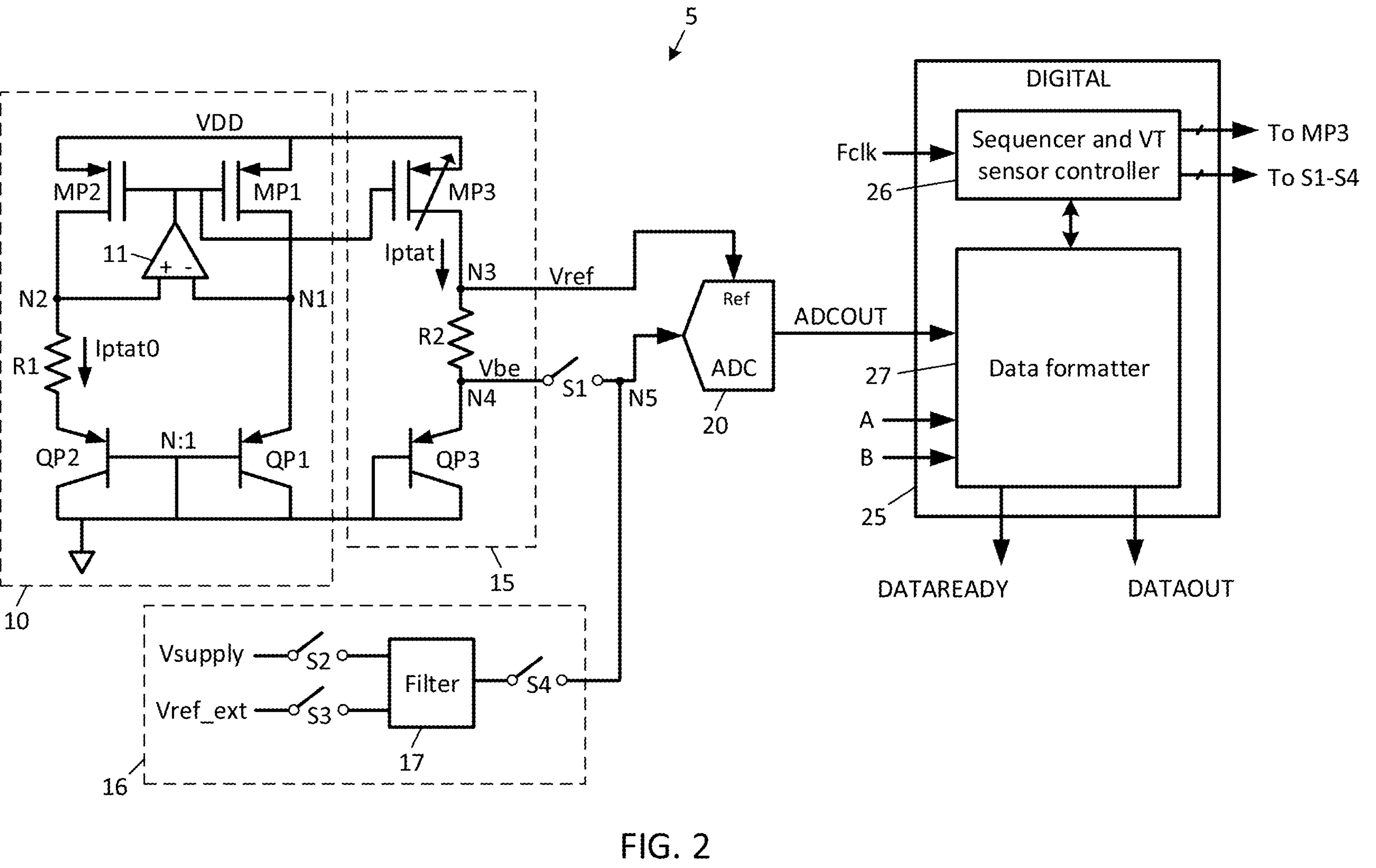
FIG. 2 is a schematic diagram of a voltage and temperature sensor described herein.

A temperature sensor 5 is now described with reference to FIG. 2. This temperature sensor 5 is arranged to be incorporated and integrated within a single integrated circuit chip, and operates to report the temperature of an area of that single integrated circuit chip.

The temperature sensor 5 includes the following constituent circuits: a current generation circuit 10 that generates the current proportional to absolute temperature Iptat, a reference voltage generation circuit 15 that generates the reference voltage Vref from Iptat and outputs a voltage Vbe complementary to absolute temperature, an analog to digital converter (ADC) 20 that receives the reference voltage Vref and either Vbe from the voltage generation circuit 15 or an input voltage from an input circuit 16, and a digital circuit 25 that reads the output of the ADC 20 and controls the input circuit 16 and voltage generation circuit 15 to effectuate calibration and sensing.

First, the structure of each circuit will be described, and then the structure of the temperature sensor 5 will be described thereafter.

In greater detail, the current generation circuit 10 includes a first PNP transistor QP1 having its emitter connected to node N1, its collector grounded, and its base connected to the base of a second PNP transistor QP2. A resistor R1 is connected between node N2 and the emitter of the transistor QP2, and the collector of the transistor QP2 is grounded. A first p-channel transistor MP1 has its source connected to a supply voltage VDD, its drain connected to node N1, and its gate connected to the gate of a second p-channel transistor MP2. The transistor MP2 has its source connected to VDD and its drain connected to node N2. An operational amplifier 11 has its non-inverting terminal connected to node N2, its inverting terminal connected to node N1, and its output connected to the gates of transistors MP1 and MP2.

Notice that, as compared to the prior art, the current generation circuit 10 may not have a resistor connected between node N1 and the drain of transistor MP1, and may not have a resistor connected between node N2 and the drain of transistor MP2—the scaling of Iptat to produce Vptat and hence Vref (which is used in voltage and temperature sensing and calibration) is performed in the circuit 15.

The voltage generation circuit 15 includes an adjustable current source (shown as an adjustable third p-channel transistor MP3 which represents multiple such transistors connected in parallel) connected between the supply voltage VDD and node N3, with its gate connected to the gates of transistors MP1 and MP2. Transistors MP1, MP2, and MP3 are matched to improve Iptat current mirroring. In the context of the adjustable current source (which can also be referred to as a current DAC) being multiple parallel connected third p-channel transistors MP3, the transistors MP3 have their sources connected to VDD, their drains connected to node N3, and their gates connected to the gates of transistors MP1 and MP2 as well as to the output of the operational amplifier 11. A resistor R2 is connected between nodes N3 and N4. A third PNP transistor QP3 has its emitter connected to node N4, its collector connected to ground, and it is diode coupled so its base is connected to its collector.

The analog to digital converter (ADC) 20 derives its reference voltage from node N3 (with or without voltage buffering), has its input connected to node N5, and has its output bits ADCOUT connected to the digital circuit 25. A switch S1 selectively connects node N4 to node N5. Through the switches S1 through S4, Vbe, Vsupply, and Vref_Ext (after filtering) can be provided through different channels of the ADC, and as different inputs (without loss of generality) or through a single channel with muxing (multiplexing) done outside the ADC.

The input circuit 16 includes a filter circuit 17 having a first input selectively connected to receive a supply voltage to test Vsupply by a switch S2, a second input selectively connected to receive an external reference voltage Vref_ext by a switch S3, and an output selectively connected to node N5 by a switch S4. The filter circuit 17 can be used for removing noise from the voltage signals Vsupply and Vref_ext, and also to scale such voltages appropriately to bring them suitably within the operating range of the ADC 20.

The digital circuit 25 includes a sequencer and thermal sensor controller 26 receiving primarily a clock signal Folk used by the digital circuit 25 and receiving data from a data formatter 27. The data formatter 27 has inputs receiving the output ADCOUT of the ADC 20, a first value A, and a second value B, and has outputs providing a DATAREADY and a DATAOUT signal. The DATAREADY indicates that the data formatter 27 is ready to output another data word, and the DATAOUT is the data word that is being outputted (e.g., the digital representation of voltage or temperature sensing/calibration data).

In operation, operational amplifier 11 drives the gates of transistors MP1 and MP2 to force the voltage at the inverting input of the amplifier 11 to be equal to the voltage at the non-inverting input of the amplifier 11, and therefore forces equality in the gate to drain voltages of transistors MP1 and MP2. This results in the base to emitter voltage Vbe1 of PNP transistor QP1 (which is a voltage complementary to absolute temperature Vctat) appearing at the drain of transistor MP2. Those skilled in the art will appreciate that this operational amplifier 11 can have a finite offset voltage, which may appear as error between its input terminals. Therefore, chopping of this operational amplifier 11 may be required to average out the inaccuracies resulting from these offset voltages. Since resistor R1 is between the voltages Vbe1 and Vbe2 (the base to emitter voltage of transistor QP2), the voltage across resistor R1 is Vbe1-Vbe2, which can be referred to as ΔVbe. The resulting current Iptat0 applied through resistor R1 is proportional to absolute temperature and flows into PNP transistors QP2 and QP1.

The current Iptat0 can be represented as:

$$Iptat = \frac{\Delta Vbe}{R1}$$

The voltage at node N1 is Vctat (the base to emitter voltage Vbe of transistor QP1). Since the adjustable current source MP3 is connected in a current mirroring arrangement with transistors MP1 and MP2, a PTAT current Iptat (which is a multiple of Iptat0, said multiple depending on how many of the parallel connected transistors MP3 are activated) is sourced from the drain of the adjustable current source MP3 and flows through resistor R2 to thereby generate a reference voltage Vref at node N3. The reference voltage Vref can be represented as:

$$Vref = Vctat + \frac{\Delta Vbe}{R1} R2 = Vctat + \alpha\Delta Vbe = Vctat + Vptat$$

The temperature sensor 5 first operates in a voltage calibration phase, shown in FIG. 3A. In the calibration phase, switches S3 and S4 are closed and switches S1 and S2 are opened, such that the ADC 20 receives Vref from 10 as its reference voltage and Vref_ext at its input. The value of Vref_EXT is chosen to be within the expected input range of the ADC. The aim is to have the number of scaling multiples of the transistor MP3 turned ON be such that the resulting reference voltage Vref from block 15 is equal to the bandgap reference voltage. The digital word ADCOUT output by the ADC 20 represents a ratio between Vref_ext and Vref. Based on this digital word ADCOUT, the digital circuit 25 adjusts the adjustable current source MP3 (i.e., activates more of the parallel connected transistors MP3 to thereby increase the magnitude of Iptat or activates less of the parallel connected transistors MP3 to thereby decrease the magnitude of Iptat and hence causing a respective change in Vref). Specifically, when ADCOUT is digitally representing a greater value than the expected ratio Vref_ext/Vref (e.g., 0.5), the adjustable current source MP3 is adjusted so that the magnitude of Iptat is increased, thereby increasing Vref and reducing the Vref_Ext/Vref ratio. When ADCOUT is digitally representing a value less than the expected ratio Vref_ext/Vref, the adjustable current source MP3 is adjusted so that the magnitude of Iptat is decreased, thereby reducing Vref and increasing the Vref_Ext/Vref ratio. The temperature sensor 5 continues to operate during this voltage calibration, meaning that the ADC 20 is periodically sampling its inputs again to periodically produce new values of ADCOUT, and one adjustment of the adjustable current source MP3 is performed by the digital circuit 25 for each new value of ADCOUT.

This adjusting is performed until ADCOUT is digitally representing the ratio Vref_ext/Vref to its maximum possible precision. This completes calibration of the reference voltage Vref (correcting for Vbe spread; correcting for the slope of Vbe and a scaling error or scaling ratio error between the current generation circuit 10 and the voltage generation circuit 15), and the calibrated version of internal reference Vref may be referred to as Vref_Cal. The number of branches of MP3 (or a voltage calibration code VCALCODE) thus obtained can be stored in a one-time programmable (OTP) memory, or any other storage memory, so that it can be used to reproduce Vref_Cal whenever required for the silicon die into which the temperature sensor 5 is incorporated.

Figure 3B:
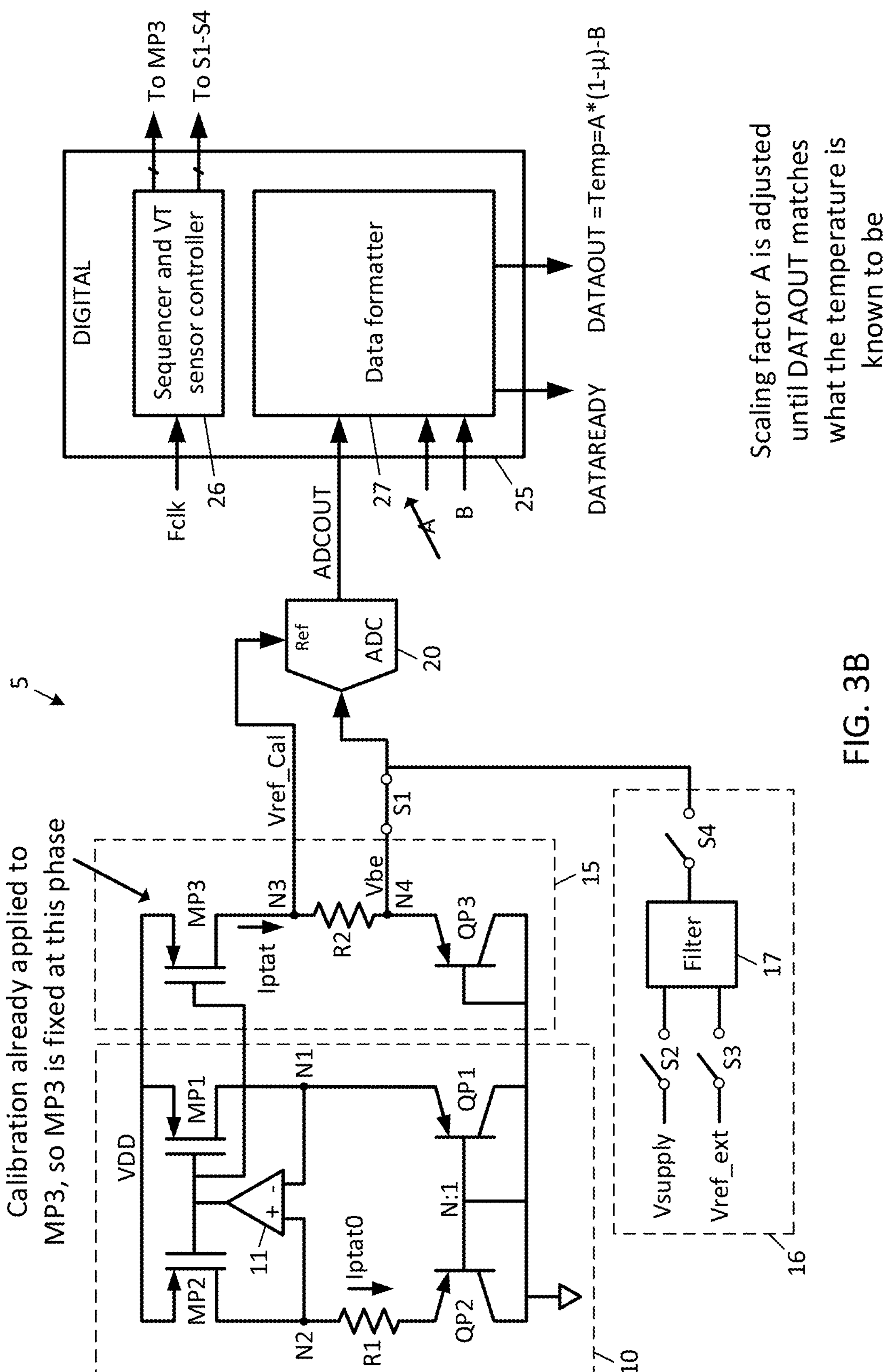
FIG. 3B shows the voltage and temperature sensor of FIG. 2 when performing temperature measurement calibration.

The temperature sensor 5 next operates in a temperature calibration phase, shown in FIG. 3B. In the temperature calibration phase, switch S1 is closed while the other switches are open. As such, the ADC 20 receives the calibrated reference voltage Vref_Cal and Vbe at its inputs, and the digital word ADCOUT output by the ADC 20 represents a ratio between Vbe and Vref_Cal. Keeping in mind that Vbe=Vctat and here calculating μ=Vctat/Vref_Cal, the temperature here can be calculated by the digital circuit 25 as:

$$T = A \times (1 - \mu) - B$$

In this implementation A and B are constants, and initially standard pre-known values are used for both A and B. To perform temperature calibration, the digital circuit 25 compares the temperature T as calculated to an input that specifies what the temperature is known to actually be, and adjusts the constant A based upon a mathematical comparison between the calculated temperature T and the known die temperature (in thermal equilibrium with the surrounding area) undergoing temperature calibration. In particular, A is adjusted such that the calculated temperature T matches the accurately measured temperature of the die from outside. B is set dependent upon the units to be used to report the temperature (e.g., Celsius, Kelvin) and also corrects for any offset errors.

This temperature calibration may be performed in a chamber with a known temperature. For example, the chip into which the temperature sensor 5 is integrated may be placed into a chamber maintained at 27° C. (and left for sufficient time to achieve thermal equilibrium with its surroundings), which is the known temperature, and the temperature calibration is performed.

As per a non-limiting example, if the calculated temperature T is less than the known temperature, then A is increased and the calculated temperature T is recalculated. If the calculated temperature T is greater than the known temperature, then A is decreases and the calculated temperature T is recalculated. After each recalculation, the comparison between the calculated temperature T and the known temperature is performed again, and adjustment of the constant A is performed again, and this continues until the calculated temperature T matches the known temperature to sufficient precision of A. This completes the calibration of the temperature calculation and sensing, and the calibrated version of A may be referred to as A_Calcode and can be stored in a permanent memory to be used for accurate temperature readings for the silicon die into which the temperature sensor 5 is incorporated.

Temperature sensing in a normal operation mode may now be performed after Vref calibration and temperature calibration to find the present temperature of the chip. Temperature sensing is now described with FIG. 3C, and in this mode, switch S1 is closed while the other switches are open.

The ADC 20 receives Vref_Cal as its reference voltage and Vbe at its input, and the digital word ADCOUT output by the ADC 20 represents a ratio between Vbe and Vref_Cal. Keeping in mind that Vbe=Vctat and μ=Vctat/Vref_Cal, the temperature can be calculated by the digital circuit 25 as:

$$T = \text{A\_calcode} \times (1 - \mu) - B$$

Thus, the temperature sensor 5 is working properly here, and temperature sensing may be continued for as long as desired.

In some applications, it may be desired for the temperature sensor 5 to have the additional function of testing a voltage so that the present absolute value of that voltage may be known. In the illustrated example, the supply voltage Vsupply is the sensed voltage.

In this voltage sensing mode, switches S2 and S4 are closed, while switches S1 and S3 are open. As a result, Vsupply is supplied to the input of ADC 20, and as such, ADCOUT represents a ratio between Vsupply and Vref_cal. Since Vref_cal is a known value, from ADCOUT, the value of Vsupply can be calculated.

The design of the temperature sensor 5 offers numerous advantages. For example, the output impedance of the voltage generation circuit 15 may be scaled as desired to suit the ADC 20 and the desired sampling speed, without impacting accuracy. As opposed to prior art designs, scaling is this circuits does not accompany a corresponding 8× scaling of a parallel current or area consumed by the bipolar junction transistors. Moreover, since the calibration is achieved in current domain, it does not have problem of dealing with small calibration resistor sizes. As understood, in addition to scaling the Iptat current produced by the adjustable current source MP3, the resistor R2 and size of the transistor QP3 are to be scaled proportionately to produce the correct reference voltage Vref and CTAT voltage Vbe. Thus, overall, the temperature sensor 5 permits a much higher temperature conversion rate than prior art designs.

As another advantage, one can do away with the buffering of the reference voltage Vref for use in ADC, due to scalability of this circuit, and indeed, no buffering of Vref is performed in the temperature sensor 5, leading to area and power savings, without a loss of accuracy.

Finally, it is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A temperature sensing circuit, comprising:

a current generation circuit configured to generate an initial current proportional to absolute temperature;

a voltage generation circuit configured to mirror the initial current proportional to absolute temperature using an adjustable current source to produce a scaled current, and to source the scaled current to a first terminal of a resistor to produce an internal reference voltage at the first terminal, wherein a second terminal of the resistor has a voltage complementary to absolute temperature applied thereto;

an analog to digital converter having a reference input configured to receive the internal reference voltage, and a data input configured to selectively receive one of the voltage complementary to absolute temperature or an externally sourced voltage, wherein the analog to digital converter is configured to generate an output code indicative of a ratio between: a) either the voltage complementary to absolute temperature or the externally sourced voltage, and b) the internal reference voltage; and a digital circuit configured to determine a temperature readout from the output code, and to calibrate the internal reference voltage and the temperature readout based upon the output code.

2. The temperature sensing circuit of claim 1, wherein the digital circuit calibrates the internal reference voltage by:

passing a known reference voltage to the analog to digital converter as the externally sourced voltage; and adjusting the adjustable current source to thereby modify a magnitude of the scaled current, in turn modifying the internal reference voltage, dependent upon the output code, until the internal reference voltage is equal to the known reference voltage or equal to a known percentage of the known reference voltage.

3. The temperature sensing circuit of claim 2, wherein the digital circuit calibrates the temperature readout determination, after calibration of the internal reference voltage, by:

comparing the temperature readout from the output code to a known temperature; and adjusting a constant used in determining the temperature readout until the temperature readout matches the known temperature.

4. The temperature sensing circuit of claim 3, wherein the output code is calculated as:

$$\mu = Vctat/Vref$$

where Vctat is the voltage complementary to absolute temperature and Vref is the internal reference voltage.

5. The temperature sensing circuit of claim 4, wherein the temperature readout is determined as:

$$T = A \times (1 - \mu) - B$$

where T is the temperature, A and B are constants with A being the adjusted constant, and μ is the output code.

6. The temperature sensing circuit of claim 3, wherein the digital circuit is further configured to determine a voltage value of an external or internal supply voltage or any other voltage by passing that voltage to the analog to digital converter as the externally sourced voltage, wherein the voltage value is determined as a function of the internal reference voltage and the output code.

7. The temperature sensing circuit of claim 3, wherein the current generation circuit comprises:

a first PNP transistor having an emitter coupled to a first node, a collector coupled to ground, and a base coupled to the collector of the first PNP transistor;

a second PNP transistor having an emitter coupled to a second node through a first resistor, a collector coupled to ground, and a base coupled to the base of the first PNP transistor;

a first p-channel transistor having source coupled to a supply voltage, a drain coupled to the first node, and a gate; and a second p-channel transistor having a source coupled to the supply voltage, drain coupled to the second node, and a gate coupled to the gate of the first p-channel transistor;

wherein equality is enforced between drain currents of the first and second p-channel transistors; and wherein the first resistor is coupled between the second node and the emitter of the second PNP transistor.

8. The temperature sensing circuit of claim 7, wherein the equality is enforced between the drain currents of the first and second p-channel transistors by an operational amplifier having a non-inverting terminal coupled to the second node, an inverting terminal coupled to the first node, and an output coupled to the gates of the first and second p-channel transistors.

9. The temperature sensing circuit of claim 7, wherein the voltage generation circuit comprises:

the adjustable current source coupled between the supply voltage and a third node;

the resistor being coupled between the third node and a fourth node; and a diode coupled PNP transistor generating the voltage complementary to absolute temperature at the fourth node.

10. The temperature sensing circuit of claim 9, wherein the adjustable current source comprises an adjustable transistor arrangement having sources coupled to the supply voltage, drains coupled to the third node, and gates coupled to the gates of the first and second p-channel transistors.

11. The temperature sensing circuit of claim 7, further comprising a first switch coupled to selectively apply the voltage complementary to absolute temperature or the externally sourced voltage to the data input of the analog to digital converter; further comprising an input circuit, the input circuit comprising:

a filter;

a second switch selectively applying an external supply voltage to the filter;

a third switch selectively supplying the known reference voltage to the filter; and a fourth switch selectively supplying output from the filter to the data input of the analog to digital converter.

12. A temperature sensing circuit, comprising:

a current circuit configured to generate a current proportional to absolute temperature;

a reference circuit configured to generate an internal reference voltage as a function of the current proportional to absolute temperature and an adjustable element;

an analog-to-digital converter having a reference input coupled to the internal reference voltage, and a data input selectively coupled to receive either a voltage complementary to absolute temperature or an external voltage; and a digital circuit configured to:

derive a temperature indication based on an output of the analog-to-digital converter; and calibrate at least one of the internal reference voltage or the temperature indication using the output of the analog-to-digital converter.

13. The temperature sensing circuit of claim 12, wherein the digital circuit calibrates the internal reference voltage by comparing output of the analog-to-digital converter against a known reference voltage applied to the data input and adjusting the adjustable element until the internal reference voltage corresponds to the known reference voltage.

14. The temperature sensing circuit of claim 12, wherein the digital circuit calibrates the temperature indication by comparing the derived temperature indication to a known temperature and adjusting a constant used in determining the temperature indication until agreement is achieved.

15. The temperature sensing circuit of claim 12, wherein the analog-to-digital converter generates an output code indicative of a ratio of the selected one of the voltage complementary to absolute temperature or the external voltage, and the internal reference voltage.

16. The temperature sensing circuit of claim 15, wherein the temperature indication is derived by applying a linear function to the ratio, the linear function having at least one adjustable constant set during calibration.

17. The temperature sensing circuit of claim 15, wherein the digital circuit is further configured to determine a value of a supply voltage or other external voltage by applying the external voltage to the data input of the analog-to-digital converter and evaluating the output code as a function of the internal reference voltage.

18. The temperature sensing circuit of claim 12, wherein the adjustable element comprises an adjustable current source, and the internal reference voltage is generated by applying the adjustable current source to a resistive element.

19. The temperature sensing circuit of claim 12, wherein the voltage complementary to absolute temperature is generated by a semiconductor junction biased to provide a voltage decreasing with increasing temperature.

20. The temperature sensing circuit of claim 12, wherein the digital circuit is configured to perform calibration in at least two stages including:

calibration of the internal reference voltage using a known reference voltage; and calibration of the temperature indication using a known temperature.

21. The temperature sensing circuit of claim 12, wherein the analog-to-digital converter is further configured to receive, via switching circuitry, at least one of: the voltage complementary to absolute temperature, the external voltage, or a known calibration voltage.

* * * * *